United States Patent
Lim

(10) Patent No.: US 11,670,654 B2
(45) Date of Patent: Jun. 6, 2023

(54) IMAGE SENSING DEVICE

(71) Applicant: SK hynix Inc., Icheon-si (KR)

(72) Inventor: Sung Woo Lim, Icheon-si (KR)

(73) Assignee: SK HYNIX INC., Icheon-si (KR)

(*) Notice: Subject to any disclaimer, the term of this patent is extended or adjusted under 35 U.S.C. 154(b) by 233 days.

(21) Appl. No.: 17/081,711

(22) Filed: Oct. 27, 2020

(65) Prior Publication Data
US 2021/0366962 A1 Nov. 25, 2021

(30) Foreign Application Priority Data
May 25, 2020 (KR) .......................... 10-2020-0062454

(51) Int. Cl.
H01L 27/146 (2006.01)
H01L 27/148 (2006.01)

(52) U.S. Cl.
CPC .. *H01L 27/14612* (2013.01); *H01L 27/14636* (2013.01); *H01L 27/14643* (2013.01); *H01L 27/14831* (2013.01); *H01L 27/14679* (2013.01)

(58) Field of Classification Search
CPC ................................................ H01L 27/14679
See application file for complete search history.

(56) References Cited

U.S. PATENT DOCUMENTS

| 7,132,717 | B2* | 11/2006 | Su ...................... H01L 29/4238 |
| | | | 257/E29.12 |
| 9,214,398 | B2* | 12/2015 | Lee .................... H01L 21/76879 |
| 2007/0158694 | A1* | 7/2007 | Kim ...................... H01L 21/761 |
| | | | 257/E21.63 |
| 2018/0302581 | A1 | 10/2018 | Watanabe et al. |

FOREIGN PATENT DOCUMENTS

KR 2006-0077119 A 7/2006

* cited by examiner

*Primary Examiner* — David A Zarneke
(74) *Attorney, Agent, or Firm* — Perkins Coie LLP

(57) ABSTRACT

An image sensing device includes a substrate structured to include a first surface on a first side of the substrate and a second surface on a second side of the substrate opposite to the first side and to further include a first active region and a second active region in a portion of the substrate near the second surface, at least one photoelectric conversion element formed in the substrate, and structured to generate photocharges by performing photoelectric conversion of incident light received through the first surface of the substrate, a floating diffusion region formed near the second surface of the substrate, and structured to receive the photocharges from the photoelectric conversion element and temporarily store the received photocharges, a transistor formed in the first active region, and structured to include a first source/drain region coupled to the floating diffusion region, and a well pickup region formed in the second active region, and structured to apply a bias voltage to the substrate. The first source/drain region and the well pickup region have complementary conductivities and are formed to be in contact with each other.

20 Claims, 6 Drawing Sheets

IMAGE SENSING DEVICE

CROSS-REFERENCE TO RELATED APPLICATION

This patent document claims the priority and benefits of Korean patent application No. 10-2020-0062454, filed on May 25, 2020, which is incorporated by reference in its entirety as part of the disclosure of this patent document.

TECHNICAL FIELD

The technology and implementations disclosed in this patent document generally relate to an image sensing device.

BACKGROUND

An image sensor is used in electronic devices to convert optical images into electrical signals. With the recent development of automotive, medical, computer and communication industries, the demand for highly integrated, higher-performance image sensors is rapidly increasing in various fields, for example, digital cameras, camcorders, personal communication systems (PCSs), video game consoles, surveillance cameras, medical micro-cameras, robots, etc.

SUMMARY

Various embodiments of the disclosed technology relate to an image sensing device for improving operational characteristics.

In accordance with an embodiment of the disclosed technology, an image sensing device is provided to include: at least one photoelectric conversion element formed in a semiconductor substrate including a first surface and a second surface opposite to the first surface, and configured to generate photocharges by performing photoelectric conversion of incident light received through the first surface; a floating diffusion region formed in an upper portion of the semiconductor substrate at the second surface, and configured to receive photocharges from the photoelectric conversion element and temporarily store the received photocharges; first and second active regions formed in the upper portion of the semiconductor substrate at the second surface, and defined by a device isolation region; a transistor formed in at least the first active region, and configured to include a first source/drain region coupled to the floating diffusion region; and a well pickup region formed in at least the second active region, and configured to provide a bias voltage to the semiconductor substrate by connecting to a bias voltage node, wherein the first source/drain region and the well pickup region have complementary conductivities and are formed to be in contact with each other.

In another aspect, an image sensing device may include a substrate structured to include a first surface on a first side of the substrate and a second surface on a second side of the substrate opposite to the first side and to further include a first active region and a second active region in a portion of the substrate near the second surface, at least one photoelectric conversion element formed in the substrate, and structured to generate photocharges by performing photoelectric conversion of incident light received through the first surface of the substrate, a floating diffusion region formed near the second surface of the substrate, and structured to receive the photocharges from the photoelectric conversion element and temporarily store the received photocharges, a transistor formed in the first active region, and structured to include a first source/drain region coupled to the floating diffusion region, and a well pickup region formed in the second active region, and structured to apply a bias voltage to the substrate. The first source/drain region and the well pickup region may have complementary conductivities, and may be formed to be in contact with each other.

In accordance with another embodiment of the disclosed technology, an image sensing device is provided to include a pixel array including a plurality of unit pixel groups arranged in a first direction and a second direction perpendicular to the first direction. Each of the unit pixel groups may include a floating diffusion region, a plurality of unit pixels arranged to surround the floating diffusion region and structured to generate photocharges by performing photoelectric conversion of incident light, and transmit the generated photocharges to the floating diffusion region, first to third active regions located at one side of the plurality of unit pixels and arranged along a line in the second direction the first to third active regions and the plurality of unit pixels disposed along the first direction, a reset transistor formed in the first active region and structured to include a first source/drain region coupled to the floating diffusion region, and a well pickup region formed in the second active region, and coupled to a bias voltage node to apply a bias voltage to the unit pixel group. The first source/drain region and the well pickup region may have complementary conductivities, and may be formed to be in contact with each other.

It is to be understood that both the foregoing general description and the following detailed description of the disclosed technology are illustrative and explanatory and are intended to provide further explanation of the disclosure as claimed.

BRIEF DESCRIPTION OF THE DRAWINGS

The above and other features and beneficial aspects of the disclosed technology will become readily apparent with reference to the following detailed description when considered in conjunction with the accompanying drawings.

DETAILED DESCRIPTION

This patent document provides implementations and examples of an image sensing device. Some implementations of the disclosed technology suggest designs of an image sensing device for improving operational characteristics of the image sensing device. The disclosed technology provides various implementations of an image sensing device which can improve dynamic range characteristics and low-illuminance characteristics.

Reference will now be made in detail to certain embodiments, examples of which are illustrated in the accompanying drawings. Wherever possible, the same reference numbers will be used throughout the drawings to refer to the same or similar parts. In the following description, a detailed description of related known configurations or functions incorporated herein will be omitted to avoid obscuring the subject matter.

Figure 1:
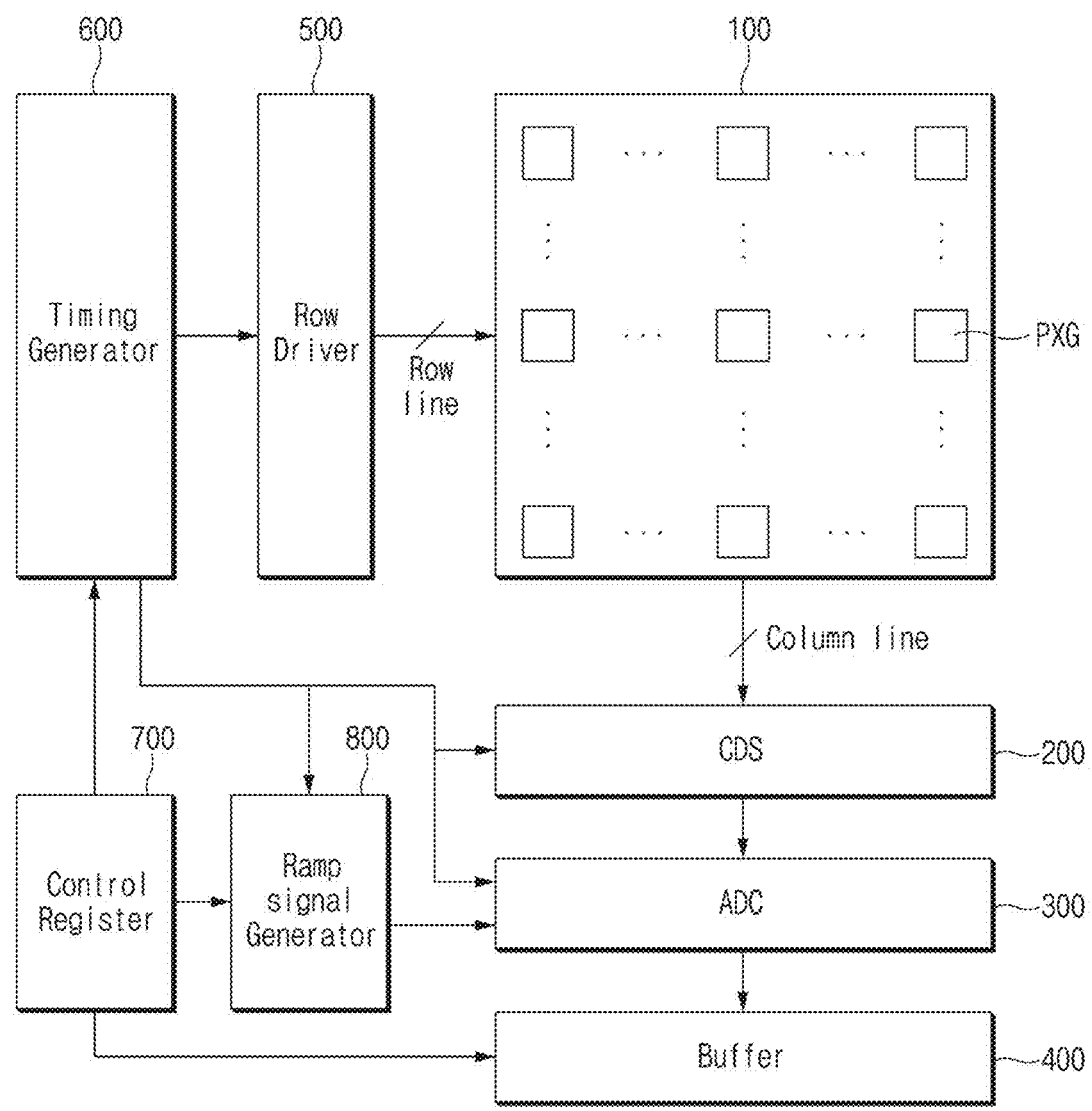
FIG. 1 is a block diagram illustrating an example of an image sensing device based on some implementations of the disclosed technology.

FIG. 1 is a block diagram illustrating an example of an image sensing device based on some implementations of the disclosed technology.

Referring to FIG. 1, the image sensing device may include a pixel array 100, a correlated double sampler (CDS) 200, an analog-to-digital converter (ADC) 300, a buffer 400, a row driver 500, a timing generator 600, a control register 700, and a ramp signal generator 800.

The pixel array 100 may include a plurality of unit pixel groups (PXGs) consecutively arranged in a two-dimensional (2D) structure in which the unit pixel groups (PXGs) are arranged in an X-axis direction and a Y-axis direction perpendicular to the X-axis direction. Each of the unit pixel groups (PXGs) may include a plurality of unit pixels. The plurality of unit pixels may convert incident light into an electrical signal (i.e., a pixel signal) corresponding to the incident light by performing photoelectric conversion of the incident light. Each unit pixel group (PXG) may include 4 unit pixels that are arranged in a (2×2) matrix structure while being contiguous or adjacent to each other. For example, each unit pixel group (PXG) may include a 4-shared pixel structure in which 4 unit pixels share a reset transistor, a source follower transistor, and a selection transistor and also share a single floating diffusion region. Each unit pixel group (PXG) may include a well pickup region for providing a bias voltage to a substrate. The well pickup region is formed in a well region in the substrate and indicates an impurity-doped region structured to apply a bias voltage to the well region. Each unit pixel may include a photoelectric conversion element for generating photocharges through conversion of incident light received from an external part, and a transfer transistor for transferring photocharges generated by the photoelectric conversion element to a floating diffusion region. The unit pixels may generate a pixel signal corresponding to the amount of photocharges stored in the floating diffusion region, and may output the pixel signal to the correlated double sampler (CDS) 200 through column lines. The unit pixel groups (PXGs) may receive a drive signal provided with various kinds of signals (e.g., a transfer control signal, a reset control signal, a selection control signal, etc.) from the row driver 500, and may operate based on the drive signal.

CMOS image sensors may use the correlated double sampling (CDS) to remove an undesired offset value of pixels by sampling a pixel signal twice to remove the difference between these two samples. In one example, the correlated double sampling (CDS) may remove the undesired offset value of pixels by comparing pixel output voltages obtained before and after a light signal is incident on the pixels so that only pixel output voltages based on the incident light can be measured. In some embodiments of the disclosed technology, the correlated double sampler (CDS) 200 may hold and sample electrical signals received from the pixels (PXs) of the pixel array 100. For example, the correlated double sampler (CDS) 200 may perform sampling of a reference voltage level and a voltage level of the received pixel signal in response to a clock signal received from the timing generator 600, and may transmit an analog signal corresponding to a difference between the reference voltage level and the voltage level of the received pixel signal to the analog-to-digital converter (ADC) 300.

The analog-to-digital converter (ADC) 300 is used to convert analog CDS signals to digital signals. Examples of the analog-to-digital converter (ADC) 300 may compare a ramp signal received from the ramp signal generator 800 with a sampling signal received from the correlated double sampler (CDS) 200, and may thus output a comparison signal indicating the result of comparison between the ramp signal and the sampling signal. The analog-to-digital converter (ADC) 300 may count a level transition time of the comparison signal in response to a clock signal received from the timing generator 600, and may output a count value indicating the counted level transition time to the buffer 400.

The buffer 400 may store each of the digital signals received from the analog-to-digital converter (ADC) 300. The buffer 400 may sense and amplify each of the digital signals, and may output each of the amplified digital signals. Therefore, the buffer 400 may include a memory (not shown) and a sense amplifier (not shown). The memory may store the count value, and the count value may be associated with output signals of the plurality of unit pixels (PXs). The sense amplifier may sense and amplify each count value received from the memory.

The row driver 500 may enable or drive the pixel array 100 in response to an output signal of the timing generator 600. For example, the row driver 500 may output the drive signal (e.g., a drive control signal, a reset control signal, a selection control signal, etc.) to the pixel array 100, and may drive the unit pixels in units of a row line. In addition, the row driver 500 may change the magnitude of a bias voltage applied to the unit pixel group (PXG) of the pixel array 100.

The timing generator 600 may generate a timing signal to control the row driver 500, the correlated double sampler (CDS) 200, the analog-to-digital converter (ADC) 300, and the ramp signal generator 800.

The control register 700 may generate control signals to control the ramp signal generator 800, the timing generator 600, and the buffer 400.

The ramp signal generator 800 may generate a ramp signal to control the signal output from the analog-to-digital converter (ADC) 300 in response to a control signal of the control register 700 and a timing signal received from the timing generator 600.

Figure 2:
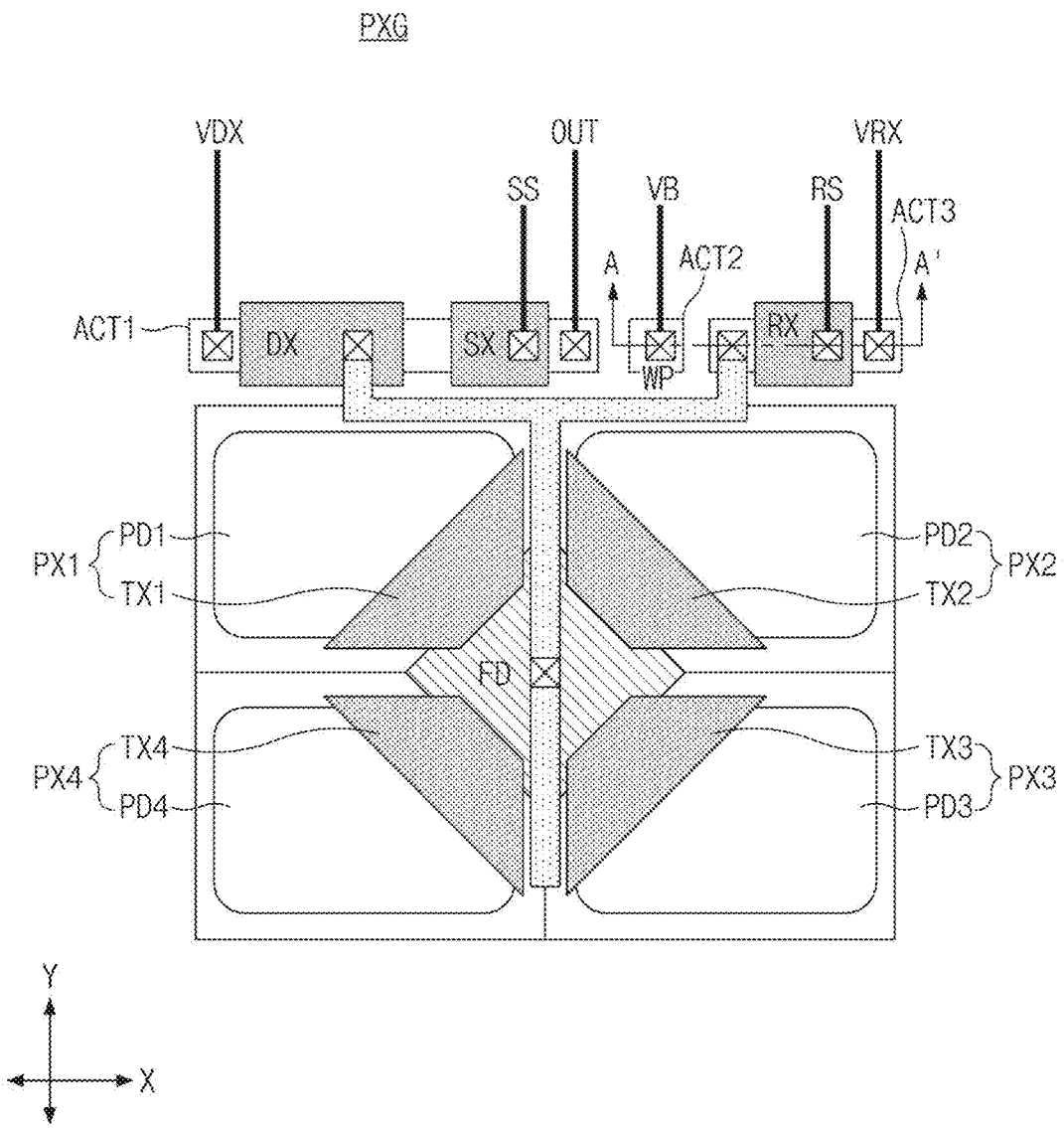
FIG. 2 is a schematic diagram illustrating an example of a shared pixel group shown in FIG. 1 based on some implementations of the disclosed technology.
Figure 3:
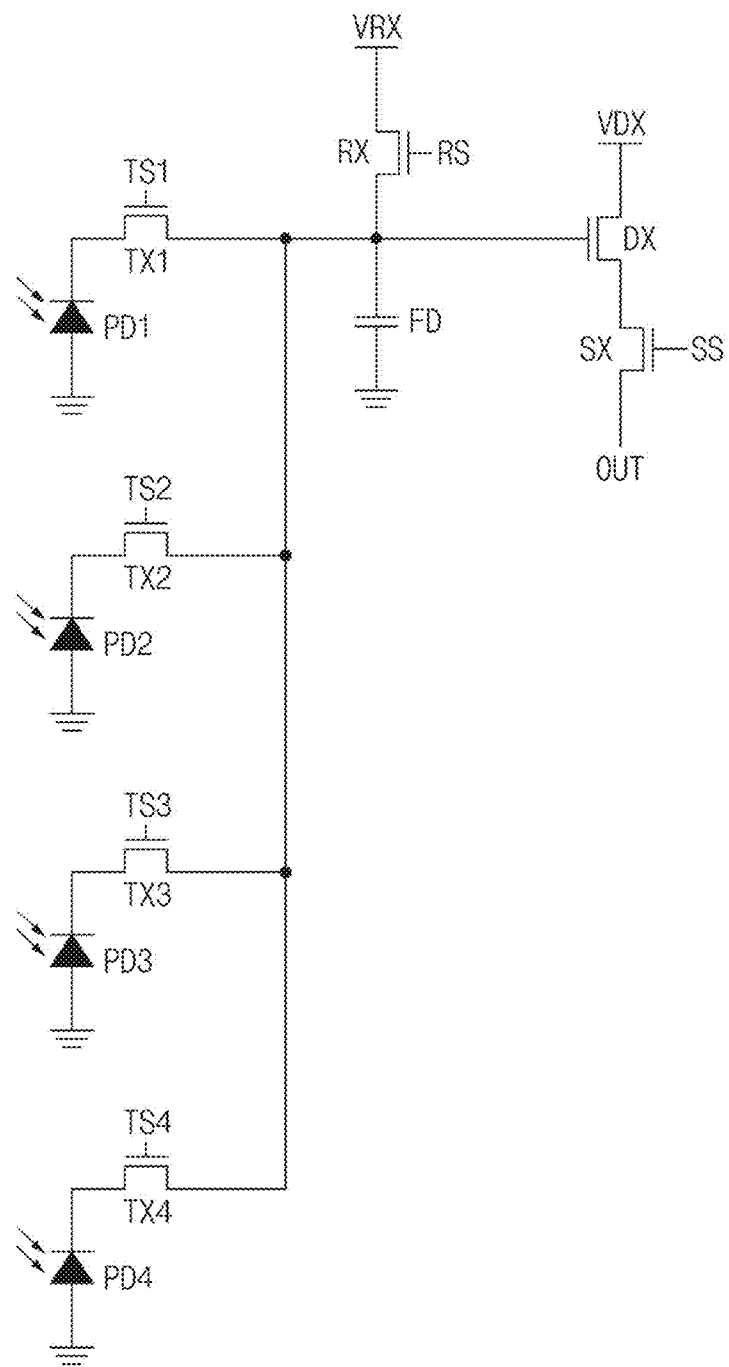
FIG. 3 is a circuit diagram illustrating an example of an equivalent circuit of the shared pixel group shown in FIG. 2 based on some implementations of the disclosed technology.

FIG. 2 is a schematic diagram illustrating an example of a shared pixel group shown in FIG. 1 based on some implementations of the disclosed technology. FIG. 3 is a circuit diagram illustrating an equivalent circuit of the shared pixel group shown in FIG. 2 based on some implementations of the disclosed technology.

Referring to FIGS. 2 and 3, each unit pixel group (PXG) may include four unit pixels PX1 to PX4, a floating diffusion region (FD), a source follower transistor (DX), a selection transistor (SX), a reset transistor (RX), and a well pickup region (WP).

In FIG. 2, reference numerals DX, SX, RX, and TX1 to TX4 are illustrated to indicate gates of the corresponding transistors for convenience of description.

The unit pixels PX1 to PX4 may respectively include the photoelectric conversion elements PD1 to PD4 to generate photocharges in response to incident light, and may respectively include the transfer transistors TX1 to TX4 to transfer photocharges generated by the photoelectric conversion elements PD1~PD4 to the floating diffusion region (FD). In some implementations, the unit pixel PX1 may include a single photoelectric conversion element PD1 and a single transfer transistor TX1, the unit pixel PX2 may include a single photoelectric conversion element PD2 and a single transfer transistor TX2, the unit pixel PX3 may include a single photoelectric conversion element PD3 and a single transfer transistor TX3, and the unit pixel PX4 may include a single photoelectric conversion element PD4 and a single transfer transistor TX4.

Each of the photoelectric conversion elements PD1 to PD4 may include an organic or inorganic photodiode. For example, the photoelectric conversion elements PD1 to PD4 may be formed in the substrate 110, and may be formed in a stacked structure in which impurity regions (P-type and N-type impurity regions) having complementary conductivities are vertically stacked.

The floating diffusion region (FD) may be formed in an upper portion of the substrate, and may temporarily store photocharges received through the transfer transistors TX1 to TX4. The floating diffusion region (FD) may be coupled to a gate of the source follower transistor (DX) and a source/drain region (e.g., a junction region) of the reset transistor (RX) through a conductive line. The floating diffusion region (FD) may include high-density N-type impurities.

The transfer transistors TX1 to TX4 may be coupled to the corresponding photoelectric conversion elements PD1 to PD4 and the floating diffusion region (FD). In some implementations, the transfer transistor TX1 may be coupled to the photoelectric conversion element PD1 and the floating diffusion region (FD). The transfer transistor TX2 may be coupled to the photoelectric conversion element PD2 and the floating diffusion region (FD). The transfer transistor TX3 may be coupled to the photoelectric conversion element PD3 and the floating diffusion region (FD). The transfer transistor TX4 may be coupled to the photoelectric conversion element PD4 and the floating diffusion region (FD). For example, one side of the transfer transistor TX1, TX2, TX3, or TX4 may be coupled to the corresponding photoelectric conversion element PD1, PD2, PD3, or PD4, and the other side of each of the transfer transistors TX1 to TX4 may be coupled to the floating diffusion region (FD). The transfer transistors TX1~TX4 may transfer photocharges generated by the photoelectric conversion elements PD1 to PD4 to the floating diffusion region (FD) in response to transfer control signals TS1 to TS4 applied to the transfer gates of the transfer transistors TX1 to TX4.

Four unit pixels PX1 to PX4 contained in the unit pixel group (PXG) may be arranged to share only one floating diffusion region (FD). For example, the four unit pixels PX1 to PX4 may be arranged to surround the floating diffusion region (FD), such that the four unit pixels PX1 to PX4 may share the floating diffusion region (FD).

The source follower transistor (DX), the selection transistor (SX), the reset transistor (RX), and the well pickup region (WP) may be arranged at one side of the unit pixels PX1 to PX4. In some implementations, the source follower transistor (DX), the selection transistor (SX), the reset transistor (RX), and the well pickup region (WP) may be formed along a line. For example, the transistors DX, SX, and RX and the well pickup region (WP) may be arranged in the X-axis direction from the left side to the right side. In some implementations, the transistors DX, SX, and RX and the well pickup region (WP) may be arranged along a line in an order in which the source follower transistor DX, the selection transistor SX, the well pickup region WP, and the reset transistor RX are sequentially arranged.

The source follower transistor (DX) may generate an amplified signal corresponding to the magnitude of electric potential of the floating diffusion region (FD), and may output the amplified signal to the selection transistor (SX). For example, the source follower transistor (DX) may amplify a change in potential of the floating diffusion region (FD), and may output the amplified potential change to the selection transistor (SX). The selection transistor (SX) may be turned on or off in response to a selection control signal (SS) applied to a gate of the selection transistor (SX), such that the selection transistor (SX) may output an output signal of the source follower transistor (DX) to the output node (OUT). The output node (OUT) may be coupled to a column line.

The source follower transistor (DX) and the selection transistor (SX) may be coupled in series between the output node (OUT) and a drive voltage node (VDX). For example, the gate of the source follower transistor (DX) and the gate of the selection transistor (SX) may be formed over a single active region ACT1 extending in the X-axis direction while being spaced apart from each other by a predetermined distance, such that the source follower transistor (DX) and the selection transistor (SX) may be coupled in series to each other while simultaneously sharing the source/drain region disposed between the gates. In the source follower transistor (DX), the source/drain region located opposite to the shared source/drain region may be coupled to the drive voltage node (VDX). In the selection transistor (SX), the source/drain region located opposite to the shared source/drain region may be coupled to the output node (OUT). The gate of the source follower transistor (DX) may be coupled to the floating diffusion region (FD) through a conductive line, and the gate of the selection transistor (SX) may receive the selection control signal (SS) through a conductive line.

The well pickup region (WP) may be formed in an active region ACT2, and may be coupled to a bias voltage node (VB) through a conductive line. In this case, the bias voltage applied to the well pickup region (WP) through the bias voltage node (VB) may be changed in magnitude according to a condition to capture a scene by the image sensing device. For example, the bias voltage may be a negative (−) voltage in the high-illuminance environment, and may be a positive (+) voltage in the low-illuminance environment. The well pickup region (WP) may include P-type (P$^+$) impurities.

The reset transistor (RX) may initialize the floating diffusion region (FD) to a reset voltage in response to the reset control signal (RS). The reset transistor (RX) may be formed in the active region ACT3. The reset transistor (RX) may be coupled between the reset voltage node (VRX) and the floating diffusion region (FD). For example, in the active region ACT3, the source/drain region of one side of the gate of the reset transistor (RX) may be coupled to the reset voltage node (VRX), and the source/drain region of the other side of the gate of the reset transistor (RX) may be coupled to the floating diffusion region (FD). The gate of the reset transistor (RX) may receive the reset control signal (RS) through a conductive line.

Each of the active regions ACT1 to ACT3 may be isolated by a device isolation region. In this case, the device isolation region may include a junction isolation structure or a trench isolation structure. The junction isolation structure may be formed by implanting high-density P-type impurities into an upper portion of the substrate. The trench isolation structure may be formed by etching the substrate to a predetermined depth and then burying the etched region with an insulation material. The trench isolation structure may include a shallow trench isolation (STI) structure.

Figure 4:
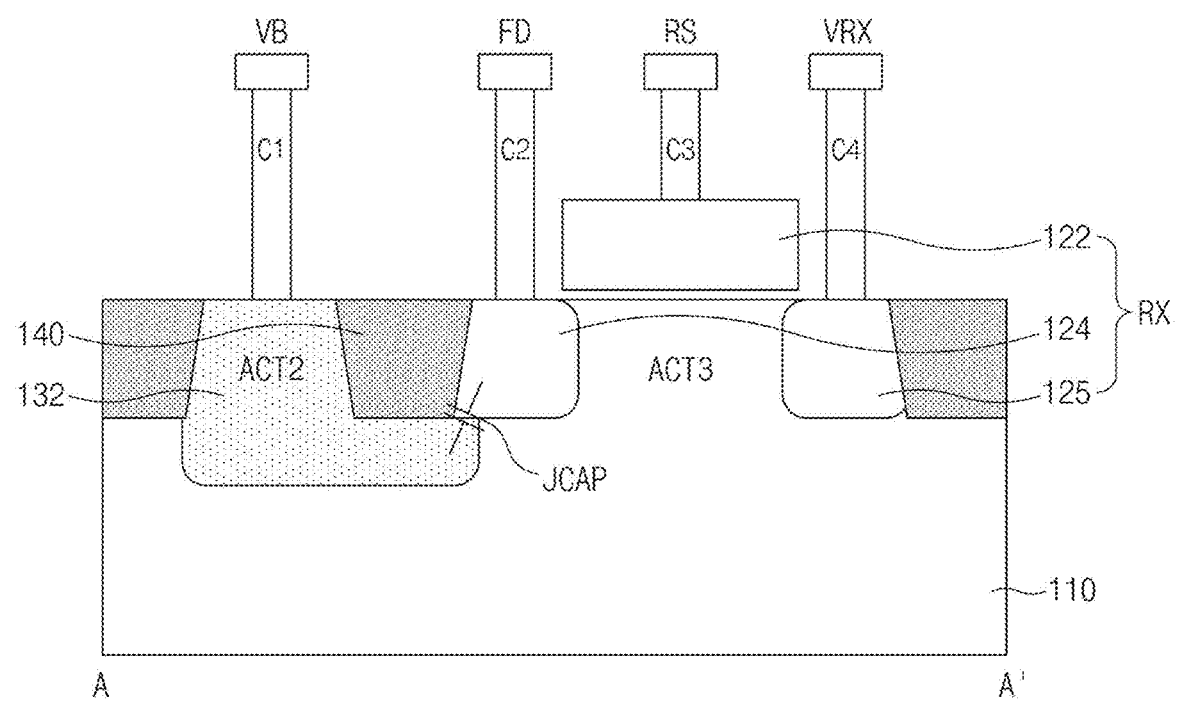
FIG. 4 is a cross-sectional view illustrating an example of the image sensing device taken along the line A-A' shown in FIG. 2 based on some implementations of the disclosed technology.

FIG. 4 is a cross-sectional view illustrating an example of the image sensing device taken along the line A-A' shown in FIG. 2 based on some implementations of the disclosed technology.

Referring to FIG. 4, the substrate 110 may include a first surface shown as the lower surface on the bottom of the substrate 110 as illustrated and a second surface on the top of the substrate 110 facing or opposite to the first surface on the bottom. The active regions ACT1 to ACT3, the transistors DX, SX, RX, and TX1 to TX4, the floating diffusion region (FD), and the well pickup region (WP) that are shown in FIG. 2 may be formed in the upper portion of the substrate 110 at or near the second surface of the substrate 110. This example image sensing device is structured as a backside illuminated image sensing device because the first surface on the bottom is the backside since the circuit elements are formed at or near the second surface on the top of the substrate 110 and the first surface on the backside is used as the reception surface to receive incident light. The substrate 110 may include a semiconductor substrate provided with low-density P-type impurities. The semiconductor substrate 110 may be in a monocrystalline state, and may include a silicon-containing material. The substrate 110 may be a thin film substrate that is formed as a thin film through a thinning process, or may include an epitaxial layer formed through epitaxial growth. For example, the substrate 110 may be or include a bulk-silicon substrate that is formed as a thin film through the thinning process.

At or near the second surface of the substrate 110, a device isolation region 140 formed to define the active regions ACT1 to ACT3 may be formed in the upper portion of the substrate 110. In the active regions ACT1 to ACT3, the transistors DX, SX, and RX and the well pickup region 132 may be formed. For convenience of description, FIG. 4 shows the active region ACT2, the active region ACT3 and the device isolation region 140 formed to define the active regions ACT2 and ACT3. The well pickup region 132 is formed in the active region ACT2, and the reset transistor RX is formed in the active region ACT3.

The device isolation region 140 may include a junction isolation structure or a trench isolation structure. The junction isolation structure may be formed by implanting high-density P-type impurities into the substrate to a predetermined depth. The trench isolation structure may be formed by etching the substrate to a predetermined depth and then burying the etched region with insulation materials.

The reset transistor (RX) may include a reset gate 122 and source/drain regions 124 and 125. The reset gate 122 may be formed over the active region ACT3, and may receive the reset control signal (RS) through a contact C3. A gate insulation layer may be formed between the reset gate 122 and the active region ACT3. The source/drain regions 124 and 125 may include N-type impurities, and may be formed in the active region ACT3 arranged at both sides of the reset gate 122. The source/drain region 124 located contiguous or adjacent to the well pickup region 132 may be coupled to the floating diffusion region (FD) through a contact C2 and a conductive line. The source/drain region 125 may be coupled to the reset voltage node (VRX) through a contact C4 and a conductive line. The source/drain regions 124 and 125 may include N-type impurities, and may have a substantially same size (e.g., a same width and a same depth). To make the source/drain regions 124 and 125 have a same size, the source/drain regions 124 and 125 may be formed by the same fabrication conditions.

The well pickup region 132 may include high-density P-type ($P^+$) impurities, and may be coupled to the bias voltage node (VB) through a contact C1 and a conductive line. The well pick up region 132 may be formed in a region defined by the device isolation region 140. The well pickup region 132 may further extend to contact either to the active region ACT3 or to a lower portion of the active region ACT3. Thus, the well pickup region 132 has a portion disposed under the source/drain region 124 of the reset transistor (RX) and overlapping with the source/drain region 124 of the reset transistor (RX). For example, the well pickup region 132 may be formed in an extended shape that is in contact with the source/drain region 124. Thus, two regions having complementary conductivities (i.e., the well pickup region 132 acting as the P-type impurity region and the source/drain region 124 acting as the N-type impurity region) may be formed to be in contact with each other. As a result, a depletion region may be formed at a junction surface between the well pickup region 132 and the source/drain region 124.

The depletion region may serve as a junction capacitor JCAP. Junction capacitance of the junction capacitor JCAP may be changed by adjusting the size of the depletion region. In this case, the magnitude of the junction capacitance may be controlled according to the magnitude of a voltage applied to the well pickup region 132. For example, when the negative (−) voltage is applied to the well pickup region 132, the depletion region may increase in size, such that the magnitude of junction capacitance can also increase. In contrast, when the positive (+) voltage is applied to the well pickup region 132, the depletion region may be reduced in size, such that the magnitude of junction capacitance can also decrease.

In addition, since the junction capacitor JCAP formed between the well pickup region 132 and the source/drain region 124 may be electrically coupled to the floating diffusion region (FD), capacitance for the floating diffusion region (FD) can be also adjusted by adjusting the magnitude of the junction capacitance. For example, since the floating diffusion region (FD) and the junction capacitor are coupled in parallel to each other, the negative (−) voltage is applied to the well pickup region 132 so as to increase junction capacitance of the depletion region, which results in the increase of capacitance of the floating diffusion region (FD). In some implementations, when the positive (+) voltage is applied to the well pickup region 132, the junction capacitance of the depletion region may decrease, which results in the decrease of capacitance of the floating diffusion region (FD).

As described above, the well pickup region 132 may be in contact with the source/drain region 124 of the transistor located contiguous or adjacent to the well pickup region 132, such that the depletion region may be formed at a junction surface between the well pickup region 132 and the source/drain region 124. In addition, the magnitude of the voltage applied to the well pickup region 132 may be adjusted, such that a conversion gain for the floating diffusion region (FD) can also be adjusted. As a result, dynamic range characteristics of the image sensing device can be improved through the adjustment of such conversion gain.

Figure 5:
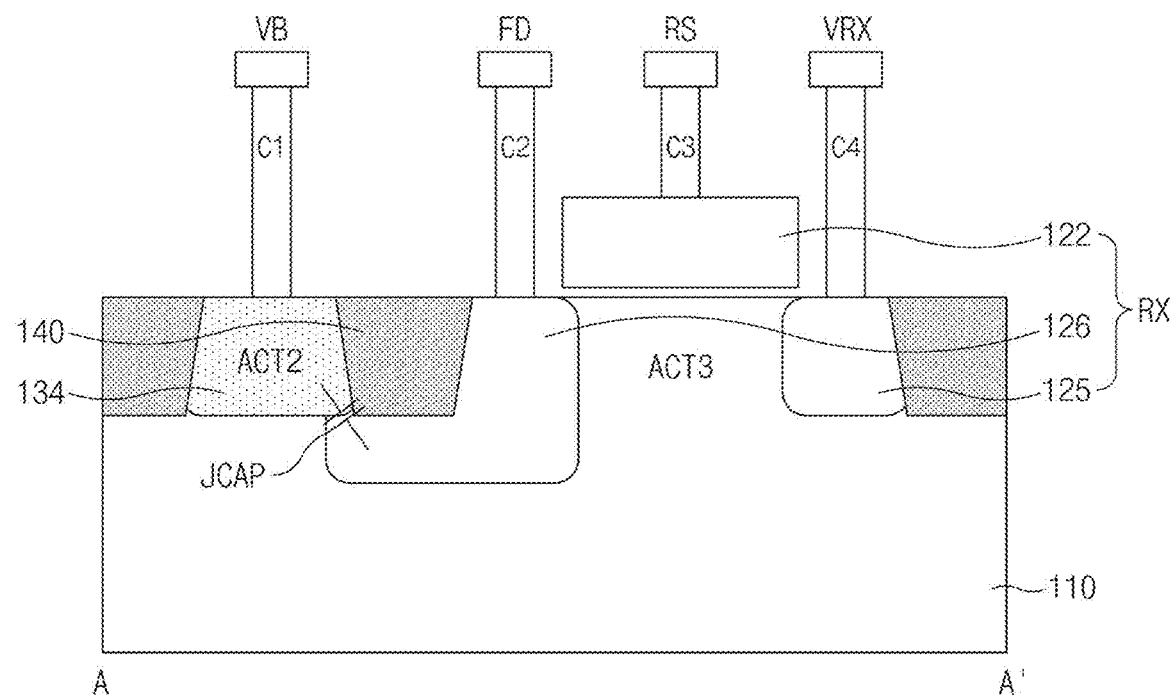
FIG. 5 is a cross-sectional view illustrating an example of the image sensing device taken along the line A-A' shown in FIG. 2 based on some implementations of the disclosed technology.

FIG. 5 is a cross-sectional view illustrating an example of the image sensing device taken along the line A-A' shown in FIG. 2 based on some other implementations of the disclosed technology.

Referring to FIG. 5, the reset transistor (RX) may include a reset gate 122 and source/drain regions 125 and 126. The source/drain regions 125 and 126 may include N-type impurities. In this case, the source/drain region 125 may be formed only in the active region ACT3. The source/drain region 126 located contiguous or adjacent to the well pickup region 134 may be formed in the active region ACT3. The source/drain region 126 may further extend to contact either to the active region ACT2 or to a lower portion of the active region ACT2. Thus, the source/drain region 126 has a portion disposed under the well pickup region 134 and overlapping with the well pickup region 134. For example, the source/drain region 126 may have a shape extending to be in contact with the well pickup region 134.

The well pickup region 134 may include high-density P-type (P⁺) impurities, and may be coupled to the bias voltage node (VB) through a contact C1 and a conductive line. The well pickup region 134 may be formed only in the active region ACT2 defined by the device isolation region 140.

The structure shown in FIG. 4 illustrates that the well pickup region 132 is in contact with the source/drain region 124 through extension of the well pickup region 132 and the structure shown in FIG. 5 illustrates that the well pickup region 134 is in contact with the source/drain region 126 through extension of the source/drain region 126 of the reset transistor (RX).

As described above, the well pickup region 134 acting as the P-type impurity region is in contact with the source/drain region 126 acting as the N-type impurity region, such that the depletion region may be formed at a junction surface between the well pickup region 134 and the source/drain region 126.

Functions of the above-mentioned depletion region are identical to functions of the depletion region formed at a junction surface between the well pickup region 132 and the source/drain region 124 shown in FIG. 4, and as such a detailed description thereof will herein be omitted for convenience of description.

Figure 6:
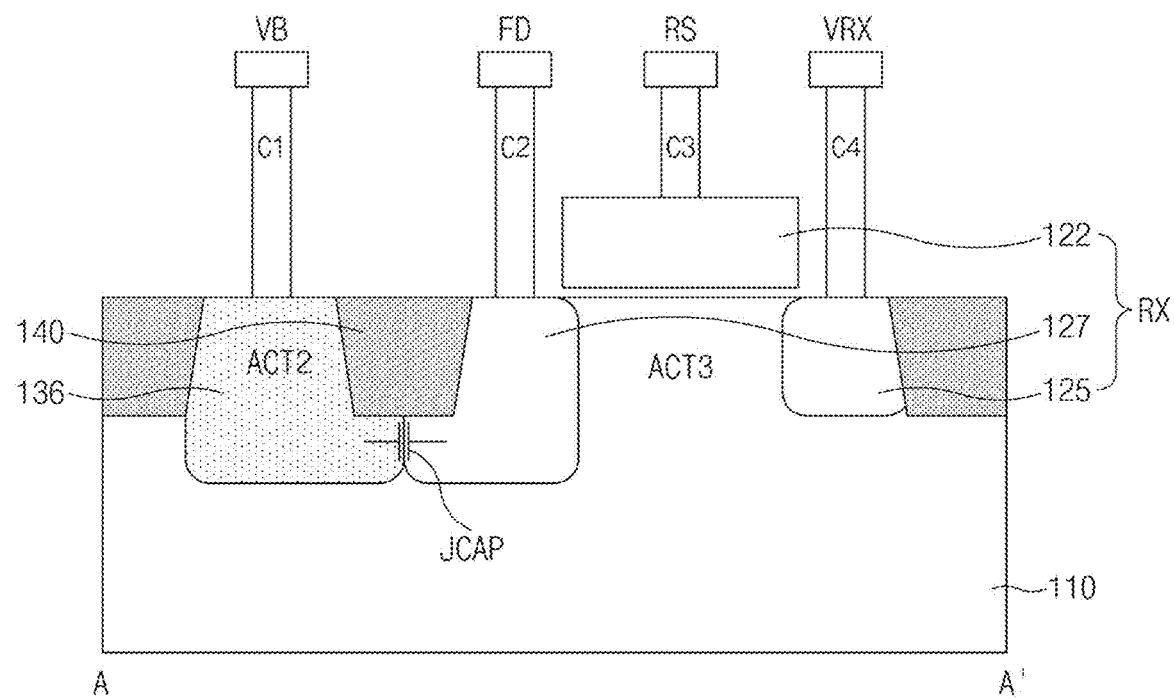
FIG. 6 is a cross-sectional view illustrating an example of the image sensing device taken along the line A-A' shown in FIG. 2 based on some implementations of the disclosed technology.

FIG. 6 is a cross-sectional view illustrating an example of the image sensing device taken along the line A-A' shown in FIG. 2 based on some other implementations of the disclosed technology.

Referring to FIG. 6, the reset transistor (RX) may include a reset gate 122 and source/drain regions 125 and 127. The source/drain regions 125 and 127 may include N-type impurities. In this case, the source/drain region 125 may be formed in the active region ACT3. The source/drain region 127 located contiguous or adjacent to the well pickup region 136 may be formed in the active region ACT3, and may extend to a lower portion of the device isolation region 140. The extended portion of the source/drain region 127, which is disposed under the device isolation region 140, may contact with the well pickup region 136 that is formed in the active region ACT2. For example, the well pick up region 136 may also have a portion extended to be under the device isolation region 140. Thus, the extended portions of the well pick up region 136 and the source/drain region 127 are disposed under the device isolation region 140 to contact to each other.

The well pickup region 136 may include high-density P-type (P⁺) impurities.

The structures shown in FIGS. 4 and 5 illustrate that the well pickup region is in contact with the source/drain region through extension of any one of the well pickup region and the source/drain region. The structure shown in FIG. 6 illustrates that the well pickup region is in contact with the source/drain region through extension of both the well pickup region and the source/drain region.

As described above, the well pickup region 136 acting as the P-type impurity region is in contact with the source/drain region 127 acting as the N-type impurity region, such that the depletion region may be formed at a junction surface between the well pickup region 136 and the source/drain region 127.

Functions of the above-mentioned depletion region are identical to functions of the depletion region formed at a junction surface between the well pickup regions 132 and 134 and the source/drain regions 124 and 126 shown in FIGS. 4 and 5, and as such a detailed description thereof will herein be omitted for convenience of description.

As is apparent from the above description, the image sensing device based on some implementations of the disclosed technology can improve dynamic range characteristics and low-illuminance characteristics.

Those skilled in the art will appreciate that the embodiments may be carried out in other specific ways than those set forth herein.

Although a number of illustrative embodiments have been described, it should be understood that numerous other modifications and embodiments can be devised based on what is described and/or illustrated in this patent document.

What is claimed is:

1. An image sensing device comprising:
   a substrate structured to include a first surface on a first side of the substrate and a second surface on a second side of the substrate opposite to the first side and to further include a first active region and a second active region in a portion of the substrate near the second surface;
   at least one photoelectric conversion element formed in the substrate, and structured to generate photocharges by performing photoelectric conversion of incident light received through the first surface of the substrate;
   a floating diffusion region formed near the second surface of the substrate and structured to receive the photocharges from the photoelectric conversion element and temporarily store the received photocharges;
   a transistor formed in the first active region, and structured to include a first source/drain region coupled to the floating diffusion region; and
   a well pickup region formed in the second active region, and structured to apply a bias voltage to the substrate,
   wherein the first source/drain region and the well pickup region have complementary conductivities and are formed to be in contact with each other.

2. The image sensing device according to claim 1, wherein:
   the first source/drain region is formed in the first active region; and
   the well pickup region is formed to extend from the second active region to the first source/drain region.

3. The image sensing device according to claim 1, wherein:
   the well pickup region is formed in the second active region; and
   the first source/drain region is formed to extend from the first active region to the well pickup region.

4. The image sensing device according to claim 1, wherein the substrate further includes a device isolation region formed between the first active region and the second active region in the upper portion of the substrate, and wherein both the first source/drain region and the well pickup region are formed to extend to a lower portion of the device isolation region.

5. The image sensing device according to claim 1, wherein the at least one photoelectric conversion element includes:
four photoelectric conversion elements arranged to surround the floating diffusion region.

6. The image sensing device according to claim 5, wherein:
the floating diffusion region is shared by the four photoelectric conversion elements.

7. The image sensing device according to claim 1, wherein the transistor includes:
a reset transistor structured to initialize the floating diffusion region to a reset voltage in response to a reset control signal and including a second source/drain region coupled to a reset voltage node.

8. The image sensing device according to claim 1, further comprising:
a third active region isolated from the first and second active regions by a device isolation region, and arranged in a line together with the first and second active regions.

9. The image sensing device according to claim 8, further comprising:
a second transistor and a third transistor that are structured to share the third active region and are formed in the third active region.

10. The image sensing device according to claim 9, wherein the second transistor includes:
a source follower transistor structured to generate an amplified signal corresponding to a magnitude of electric potential of the floating diffusion region, and output the amplified signal to the third transistor.

11. The image sensing device according to claim 10, wherein the third transistor includes:
a selection transistor structured to output the amplified signal received from the second transistor to an output node in response to a selection control signal.

12. The image sensing device according to claim 1, wherein:
the well pickup region includes P-type impurities; and
the first source/drain region includes N-type impurities.

13. The image sensing device according to claim 1, wherein the substrate further includes a device isolation region formed between the first active region and the second active region in the upper portion of the substrate, and
wherein the well pick up region has a portion disposed under the device isolation region.

14. An image sensing device comprising:
a pixel array including a plurality of unit pixel groups arranged in a first direction and a second direction perpendicular to the first direction,
wherein each of the unit pixel groups includes:
a floating diffusion region;
a plurality of unit pixels arranged to surround the floating diffusion region and structured to generate photocharges by performing photoelectric conversion of incident light and transmit the generated photocharges to the floating diffusion region;
first to third active regions located at one side of the plurality of unit pixels and arranged along a line in the second direction, the first to third active regions and the plurality of unit pixels disposed along the first direction;
a reset transistor formed in the first active region and structured to include a first source/drain region coupled to the floating diffusion region; and
a well pickup region formed in the second active region and coupled to a bias voltage node to apply a bias voltage to the unit pixel group,
wherein the first source/drain region and the well pickup region have complementary conductivities and are formed to be in contact with each other.

15. The image sensing device according to claim 14, wherein:
the first source/drain region is formed in the first active region; and
the well pickup region is formed to extend from the second active region to the first source/drain region.

16. The image sensing device according to claim 14, wherein:
the well pickup region is formed in the second active region; and
the first source/drain region is formed to extend from the first active region to the well pickup region.

17. The image sensing device according to claim 14, wherein the each of the unit pixel groups further includes a device isolation region formed between the first active region and the second active region, and
Wherein both the first source/drain region and the well pickup region are formed to extend to a lower portion of the device isolation region.

18. The image sensing device according to claim 14, further comprising:
a source follower transistor formed in the third active region, and structured to generate an amplified signal corresponding to a magnitude of electric potential of the floating diffusion region by connecting to the floating diffusion region through a gate terminal thereof; and
a selection transistor formed in the third active region, and structured to output the amplified signal received from the source follower transistor to an output node in response to a selection control signal.

19. The image sensing device according to claim 14, wherein:
the well pickup region includes N-type impurities; and
the first source/drain region includes P-type impurities.

20. The image sensing device according to claim 14, wherein the well pick up region has a portion disposed under the first source/drain region.

* * * * *